United States Patent [19]
Smayling et al.

[11] Patent Number: 6,060,372
[45] Date of Patent: May 9, 2000

[54] METHOD FOR MAKING A SEMICONDUCTOR DEVICE WITH IMPROVED SIDEWALL JUNCTION CAPACITANCE

[75] Inventors: Michael C. Smayling; Alister C. Young, both of Missouri City; John A. Rodriguez, Houston; Jihong Chen, Plano, all of Tex.

[73] Assignee: Texas Instruments Incorporated, Dallas, Tex.

[21] Appl. No.: 08/823,286

[22] Filed: Mar. 21, 1997

[51] Int. Cl.[7] .......................... H01L 21/822; H01L 21/265
[52] U.S. Cl. ........................ 438/442; 257/389; 438/297; 438/298
[58] Field of Search ...................... 438/237, 298, 438/297, 271, 234, 442; 257/389

[56] References Cited

U.S. PATENT DOCUMENTS

| | | | |
|---|---|---|---|
| 5,023,690 | 6/1991 | Verret et la. ................................. | 357/43 |
| 5,145,798 | 9/1992 | Smayling et al. ......................... | 437/44 |
| 5,242,841 | 9/1993 | Smayling et al. ......................... | 437/29 |
| 5,407,884 | 4/1995 | Smayling et al. ........................ | 438/234 |
| 5,491,105 | 2/1996 | Smayling et al. ........................ | 438/271 |
| 5,585,294 | 12/1996 | Smayling et al. ...................... | 438/297 |
| 5,686,347 | 11/1997 | Yang ........................................ | 438/298 |

OTHER PUBLICATIONS

Silicon Processing for the VSLI ERA Stanley Wolf Lattice Press p. 21, 1990.

*Primary Examiner*—Charles Bowers
*Assistant Examiner*—David S Blum
*Attorney, Agent, or Firm*—Robert D. Marshall, Jr.; Gerald E. Laws; Richard L. Donaldson

[57] ABSTRACT

A semiconductor device (10) of the present invention has a gate (32) insulatively disposed above the substrate, source and drain regions (36, 38) disposed near the surface in the substrate adjacent opposite sides of the gate (32), and a field oxide region (26) disposed in the surface of the substrate surrounding the source and drain regions (36, 38) and defining an active moat region (20). The channel stop region (24) is disposed below the field oxide region (26) and is spaced from the active moat region (20) with a predetermined spacing.

14 Claims, 2 Drawing Sheets

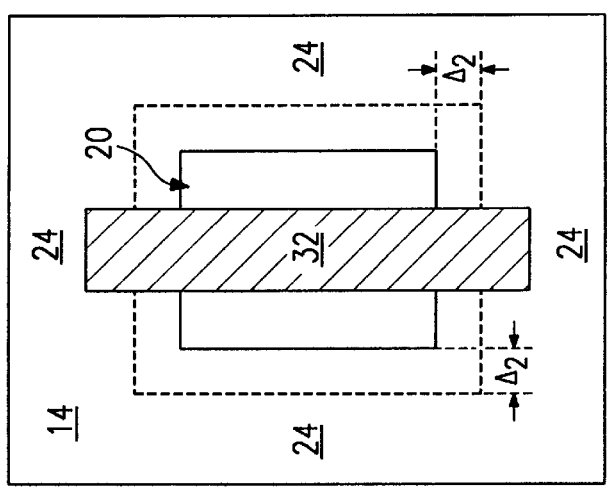
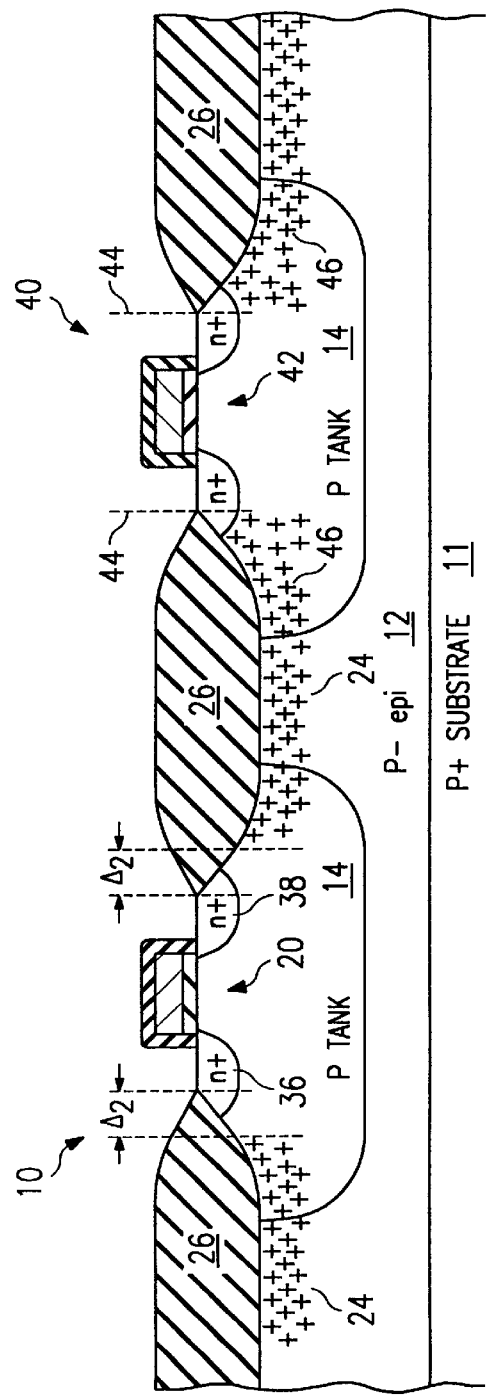

METHOD FOR MAKING A SEMICONDUCTOR DEVICE WITH IMPROVED SIDEWALL JUNCTION CAPACITANCE

TECHNICAL FIELD OF THE INVENTION

This invention is related in general to the field of semiconductor devices. More particularly, the invention is related to a semiconductor device with improved sidewall junction capacitance.

BACKGROUND OF THE INVENTION

Channel stops have been used in semiconductor devices to isolate devices from one another. To achieve good active area density, the channel stop implantation dose is self-aligned to the active moat edge. However, high sidewall junction capacitance at 0 to Vdd bias ($C_{JS}$) is experienced, which causes higher power dissipation and reduced switching speed.

To overcome the problem, most circuit designers attempt to compensate for the higher capacitance by using larger driver transistors to increase the drive current and improve the performance. This solution increases power consumption and does not advantageously enhance semiconductor device characteristics.

SUMMARY OF THE INVENTION

Accordingly, there is a need for a solution that addresses the high sidewall junction capacitance ($C_{JS}$) caused by isolation channel stops to achieve reduced power dissipation and faster circuit speed.

In accordance with the present invention, a semiconductor device with reduced $C_{JS}$ and a method for fabricating the same are provided which eliminate or substantially reduce the disadvantages associated with prior semiconductor devices.

In one aspect of the invention, the semiconductor device has a gate insulatively disposed above the substrate, source and drain regions disposed near the surface in the substrate adjacent opposite ends of the gate, and a field oxide region disposed in the surface of the substrate surrounding the source and drain regions and defining an active moat edge. The channel stop region is disposed below the field oxide region and is spaced from the active moat edge with a predetermined spacing.

In another aspect of the invention, a variety of semiconductor devices are fabricated on a semiconductor substrate where certain selected semiconductor devices are manufactured with a spacing between the channel stop and the active moat region to achieve faster circuit speed for critical data paths, for example.

In yet another aspect of the invention, a method for fabricating semiconductor devices with a reduced $C_{JS}$ on a semiconductor substrate is provided. The method includes the steps of first forming a pad oxide layer over the face of the semiconductor substrate, then forming a patterned silicon nitride layer over the pad oxide layer and defining an active moat region in the substrate. A channel stop region is then selectively formed in the substrate spaced from the active moat region. A field oxide is then formed above the channel stop region and aligned with the active moat region. A gate is then formed insulatively above the substrate and above the active moat region, and source and drain regions are formed in the active moat region on opposing sides of the gate.

A technical advantage of the present invention is the reduced $C_{JS}$, which in turn decreases power consumption and dissipation, and increases circuit speed. Further technical advantages include a higher junction breakdown voltage. When semiconductor devices are constructed according to the teachings of the present invention, the channel stop mask is offset to produce a spacing between the channel stop and the active moat region. A semiconductor substrate may be manufactured with selected semiconductor devices having the moat-to-channel stop spacing in critical data paths where speed is a premium, and no extra spacing in other regions like RAM or ROM cells.

BRIEF DESCRIPTION OF THE DRAWINGS

For a better understanding of the present invention, reference may be made to the accompanying drawings, in which:

FIG. 2 is a plan view of the metal oxide semiconductor device manufactured according to the teachings of the present invention; and FIG. 3 is a cross-sectional view of a first metal oxide semiconductor device with a spacing between the channel stop region and active moat edge and a second metal oxide semiconductor device with a self-aligned channel stop region formed on the same substrate according to the teachings of the present invention.

DETAILED DESCRIPTION OF THE INVENTION

Figure 1A:
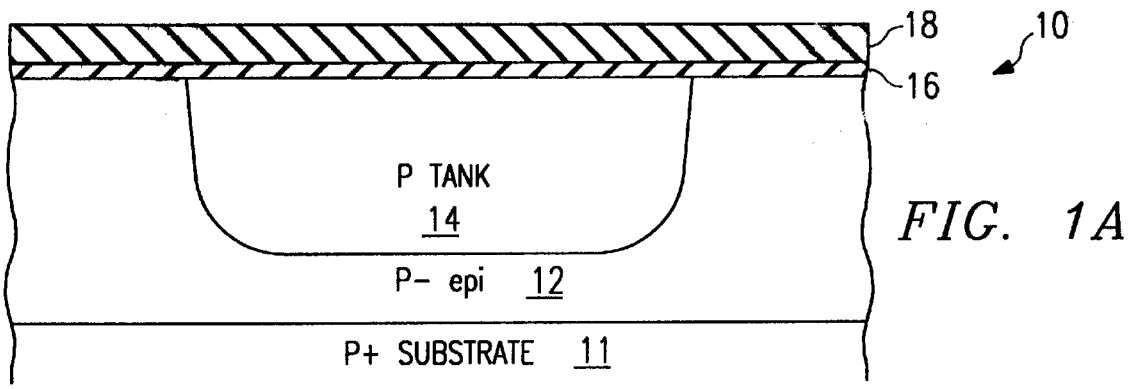
FIGS. 1A–1C are cross-sectional views of successive exemplary fabrication steps of a metal oxide semiconductor device manufactured according to the teachings of the present invention.

The preferred embodiment(s) of the present invention is (are) illustrated in FIGS. 1–3, like reference numerals being used to refer to like and corresponding parts of the various drawings.

Figure 1B:
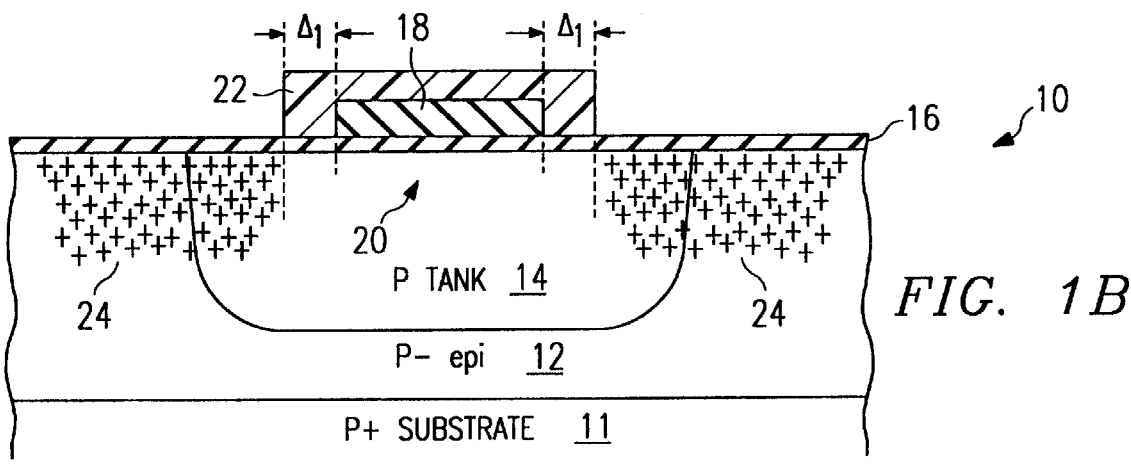
Figure 1C:
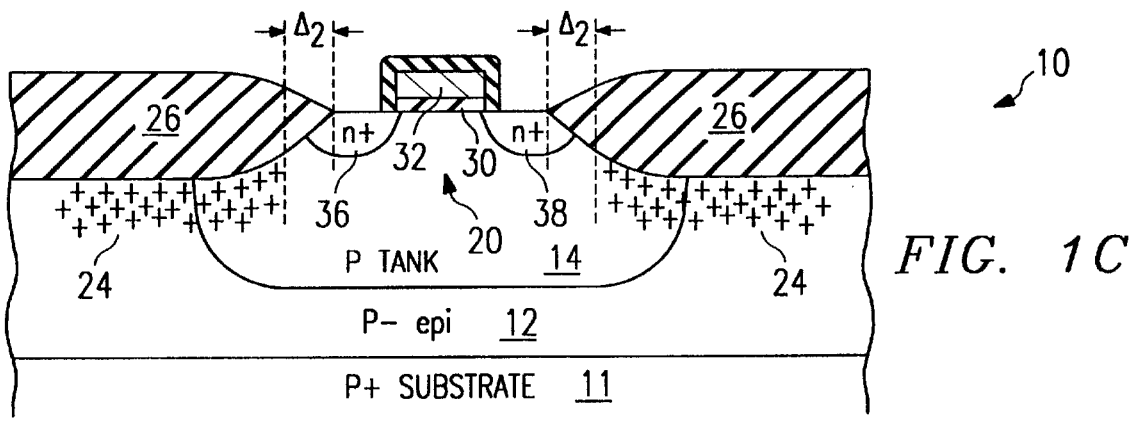

Referring to FIGS. 1A–1C, cross-sectional views of successive fabrication steps of a metal oxide semiconductor device 10 constructed according to the teachings of the present invention are shown. In FIG. 1A, a p– epitaxial layer 12 is formed on a p+ substrate 11. A p-tank 14 is then formed in epitaxial layer 12. A pad oxide layer 16 is then formed over the surface of the device. A layer of silicon nitride 18 is then formed over pad oxide layer 16.

It may be noted that p-tank 14 formed in epitaxial layer 12 described above may be a high voltage p-tank, a low voltage p-tank, or a low voltage p-tank in a high voltage n-tank according to the device application desired.

In FIG. 1B, nitride layer 18 is patterned and etched to define an active moat region 20. A photoresist 22 is deposited and patterned with a mask (not shown). Channel stop implant regions 24 are formed anywhere not protected by photoresist 22. It may be seen that photoresist 22 is patterned so that the resultant channel stop implant regions 24 are spaced from active moat region 20 with a spacing $\Delta_1$. $\Delta_1$ is chosen large enough so that misalignment between the patterned nitride region 18 and channel stop resist 22 does not reduce the resultant moat spacing. For effective device isolation, the channel stop implantation dosage is typically relatively high compared to the low voltage p-tank or high voltage p-tank doses. An exemplary channel stop implant is $1\times10^{13}$ ions/cm$^2$.

In FIG. 1C, field oxide regions 26 are formed, partially consuming silicon and channel stop implant regions 24.

Accordingly, channel stop implant regions 24 are formed at a predetermined depth as to preserve sufficiently doped regions. Channel stop implant regions 24 may diffuse deeper into epitaxial layer 12 ahead of the oxidation to achieve a deeper field stop region. Channel stop implant regions 24 may also diffuse toward active moat region 20, which may reduce the spacing therebetween to a lesser amount, $\Delta_2$. Accordingly, spacing $\Delta_1$ is preferably determined by taking into account of any narrowing of the moat-to-channel stop spacing due to subsequent fabrication steps and any misalignment. Thereafter, the remaining nitride layer 18 and pad oxide layers 16 are removed, and a gate oxide 30 and a polysilicon gate 32 are formed above active moat region 20. Source and drain regions 36 and 38 are then formed by implantation and diffusion.

Referring to FIG. 2, a plan view of the metal oxide semiconductor device 10 is shown. It may be seen that a spacing of $\Delta_2$ exists between channel stop regions 24 and active moat region 20 in the X and Y directions. Alternatively, the moat-to-channel stop spacing may differ slightly along the X and Y axes. The spacing between active moat edge 20 and channel stop regions 24 arises when the channel stop implant does not share the same pattern as the active moat edge but is spaced therefrom. The spacing can be the smallest distance to produce a satisfactorily reduced sidewall junction capacitance at 0 to Vdd bias ($C_{JS}$) and is limited only by the minimum distance to neighboring devices.

The moat-to-channel stop spacing effectively reduces the high $C_{JS}$ that is experienced when the channel stop is self-aligned to the active moat edge. It may be seen that by introducing a spacing between the active moat edge and the channel stop, a distance is established between the two p-n junctions created by the channel, source/drain, and channel stop. The spacing increases the depletion width for the junction between the drain/source and the p-tank and thus reduces the $C_{JS}$. As a result of reducing the $C_{JS}$, the moat-to-channel stop spacing reduces power dissipation and increases the switching speed of the semiconductor device. As a further benefit, the offset channel stop also permits high junction breakdown voltages and less width reduction due to channel stop encroachment.

Referring to FIG. 3, a cross-sectional view of a first metal oxide semiconductor device 10 and a second metal oxide semiconductor device 40 formed on the same substrate 11 is shown. Device 10 has a spacing, $\Delta_2$, between its channel stop region 24 and active moat region 20. On the same substrate 11, a neighboring device 40 may be constructed following similar processing steps as shown in FIGS. 1A–1C and described above. However, in the channel stop implantation processing step shown in FIG. 1B, the photoresist 22 may be patterned to be in alignment with patterned nitride layer 18 or be eliminated altogether, so that device 40 includes a channel stop region 46 that is self-aligned to its active moat region 42, where lines 44 indicate the location of the interface therebetween. Therefore, device 40, a neighbor of device 10, may have no spacing between its channel stop region 46 and active moat region 42.

In application, the channel stop may be spaced from the moat region in selective devices on a semiconductor substrate such as a data path where circuit speed is placed at a premium over packing density. Other devices on the same substrate may have self-aligned channel stop regions and therefore no spacing between the channel stop region and the active moat region. The present invention is most applicable to advanced metal oxide semiconductor processes and mixed signal devices where isolation channel stops are formed using masks, so that no additional mask and process step is required in order to create the moat-to-channel stop spacing.

It may be seen that the process steps described above to form the various semiconductor structures may employ conventional parameters such as implant dosage, implant dopant type, implant energy, diffusion temperatures, etc.

Although several embodiments of the present invention and its advantages have been described in detail, it should be understood that a myriad of mutations, changes, substitutions, transformations, modifications, variations, and alterations can be made therein without departing from the teachings of the present invention, the spirit and scope of the invention being set forth by the appended claims.

What is claimed is:

1. A method for fabricating semiconductor devices with a reduced sidewall junction capacitance $C_{JS}$ on a semiconductor substrate, comprising the steps of:

forming a pad oxide layer over the face of the semiconductor substrate;

forming a patterned silicon nitride layer over the pad oxide layer and defining an active moat region in the substrate;

selectively forming a channel stop region in the substrate spaced from the active moat region a predetermined distance selected to produce a satisfactorily reduced sidewall junction capacitance $C_{JS}$;

forming a field oxide above the channel stop region and aligned with the active moat region;

forming a gate insulatively disposed above the substrate and above the active moat region; and forming source and drain regions in the active moatregion on opposing sides of the gate.

2. The method, as set forth in claim 1, wherein the channel stop forming step comprises the steps of:

forming a patterned photoresist over the patterned silicon nitride layer, the patterned photoresist extending beyond the silicon nitride layer by a predetermined offset and defining a channel stop edge, the predetermined offset selected to provide the predetermined distance from the active moat region and the channel stop edge; and implanting dopants in the substrate forming the channel stop region.

3. The method, as set forth in claim 1, further comprising the step of forming a tank in the substrate containing the active moat region.

4. The method, as set forth in claim 1, further comprising the step of forming a high voltage tank in the substrate containing the active moat region.

5. The method, as set forth in claim 1, further comprising the steps of:

forming a high voltage tank of a second conductivity type in the substrate of a first conductivity type; and forming a low voltage tank of a first conductivity type inside the high voltage tank and containing the active moat region.

6. The method, as set forth in claim 2, wherein:

the predetermined offset which the patterned photoresist extends beyond the silicon nitride layer is selected large enough to provide the minimum predetermined distance from the active moat region and the channel stop edge in view of an expected misalignment between the patterned photoresist and the silicon nitride layer.

7. The method, as set forth in claim 2, wherein:

the predetermined offset which the patterned photoresist extends beyond the silicon nitride layer is select large enough to provide the minimum predetermined distance from the active moat region and the channel stop edge in view of any narrowing of active moat to channel stop edge spacing due to subsequent fabrication steps.

8. The method, as set forth in claim 2, wherein:

the predetermined offset which the patterned photoresist extends beyond the silicon nitride layer is selected large enough to provide the minimum predetermined from the active moat region and the channel stop edge in view of an expected misalignment between the patterned photoresist and the silicon nitride layer and any narrowing of active moat to channel stop edge spacing due to subsequent fabrication steps.

9. A method for fabricating semiconductor devices with a reduced sidewall junction capacitance $C_{JS}$ on a semiconductor substrate, comprising the steps of:

forming a pad oxide layer over the face of the semiconductor substrate;

forming a patterned silicon nitride layer over the pad oxide layer and defining a first plurality of active moat regions in the substrate;

selectively forming a second plurality of channel stop regions in the substrate spaced from some but not all of the first plurality of active moat regions a predetermined distance selected to produce a satisfactorily reduced sidewall junction capacitance $C_{JS}$;

selectively forming a third plurality of channel stop regions in the substrate spaced self aligned with those of the first plurality of active moat regions not having channel stop regions spaced therefrom;

forming a first plurality of field oxides, each field oxide above a corresponding channel stop region and aligned with a corresponding active moat region;

forming a first plurality of gates, each gate insulatively disposed above the substrate and above a corresponding active moat region; and forming a first plurality of source regions and a first plurality of drain regions in corresponding active moat regions on opposing sides of corresponding gates.

10. The method, as set forth in claim 9, wherein the step of forming the second plurality of channel stop regions in the substrate spaced from some but not all of the first plurality of active moat regions a predetermined distance comprises the steps of:

forming a patterned photoresist over the patterned silicon nitride layer, the patterned photoresist extending beyond the silicon nitride layer by a predetermined offset and defining a channel stop edge, the predetermined offset selected to provide the predetermined distance from the active moat region and the channel stop edge; and implanting dopants in the substrate forming the channel stop region.

11. The method, as set forth in claim 10, wherein:

the predetermined offset which the patterned photoresist extends beyond the silicon nitride layer is selected large enough to provide the minimum predetermined distance from the active moat region and the channel stop edge in view of an expected misalignment between the patterned photoresist and the silicon nitride layer.

12. The method, as set forth in claim 10, wherein:

the predetermined offset which the patterned photoresist extends beyond the silicon nitride layer is selected large enough to provide the minimum predetermined distance from the active moat region and the channel stop edge in view of any narrowing of active moat to channel stop edge spacing due to subsequent fabrication steps.

13. The method, as set forth in claim 10, wherein:

the predetermined offset which the patterned photoresist extends beyond the silicon nitride layer is selected large enough to provide the minimum predetermined from the active moat region and the channel stop edge in view of an expected misalignment between the patterned photoresist and the silicon nitride layer and any narrowing of active moat to channel stop edge spacing due to subsequent fabrication steps.

14. The method, as set forth in claim 9, wherein:

said step of selectively forming the second plurality of channel stop regions is selected for transistors whose speed is more critical than their packing density; and said step of selectively forming a third plurality of channel stop regions is selected for transistors whose speed is not more critical than their packing density.

* * * * *